United States Patent [19]
Hochstein

[11] Patent Number: 6,045,240
[45] Date of Patent: Apr. 4, 2000

[54] LED LAMP ASSEMBLY WITH MEANS TO CONDUCT HEAT AWAY FROM THE LEDS

[75] Inventor: Peter A. Hochstein, Troy, Mich.

[73] Assignee: Relume Corporation, Troy, Mich.

[21] Appl. No.: 08/953,942

[22] Filed: Oct. 20, 1997

Related U.S. Application Data

[63] Continuation-in-part of application No. 08/671,249, Jun. 27, 1996.

[51] Int. Cl.[7] ..................................................... F21V 29/00
[52] U.S. Cl. .......................... 362/294; 362/373; 362/249; 362/800
[58] Field of Search .................................... 362/800, 249, 362/294, 373; 257/81, 82, 88–93, 99

[56] References Cited

U.S. PATENT DOCUMENTS

| | | | |
|---|---|---|---|
| 4,729,076 | 3/1988 | Masami et al. | 362/235 |
| 5,528,474 | 6/1996 | Roney et al. | 362/249 |
| 5,632,551 | 5/1997 | Roney et al. | 362/249 |

Primary Examiner—Sandra O'Shea
Assistant Examiner—Ismael Negron
Attorney, Agent, or Firm—Howard & Howard

[57] ABSTRACT

An electrically driven L.E.D. lamp assembly (14) comprising an electrically insulating circuit board (26) having opposed first and second surfaces with light emitting diodes (28) having positive and negative leads (30, 32) mounted on the first surface. A plurality of holes extend through the board (26) and a plurality of pads (50) of thermally conductive plating are disposed on the second side with each pad (50) associated with the leads to conduct heat from each of the leads to one of the pads (50) while maintaining electrical isolation between the pads. A heat sink includes a base (36) overlying the second surface and an adhesive layer (58) of thermally conductive adhesive is disposed between the conductive plating and the heat sink (36) to secure the conductive plating and the circuit board (26) to the heat sink (36). The assembly is characterized by an electrically non-conductive spacer (56, 156) for preventing contact between the conductive plating (50) and the heat sink to prevent electrical shorting between the conductive plating (50) and the heat sink (36) while maximizing heat transfer. The spacer may comprise a pre-cured coating of the same material as the adhesive (58) or discrete elements (156).

19 Claims, 4 Drawing Sheets

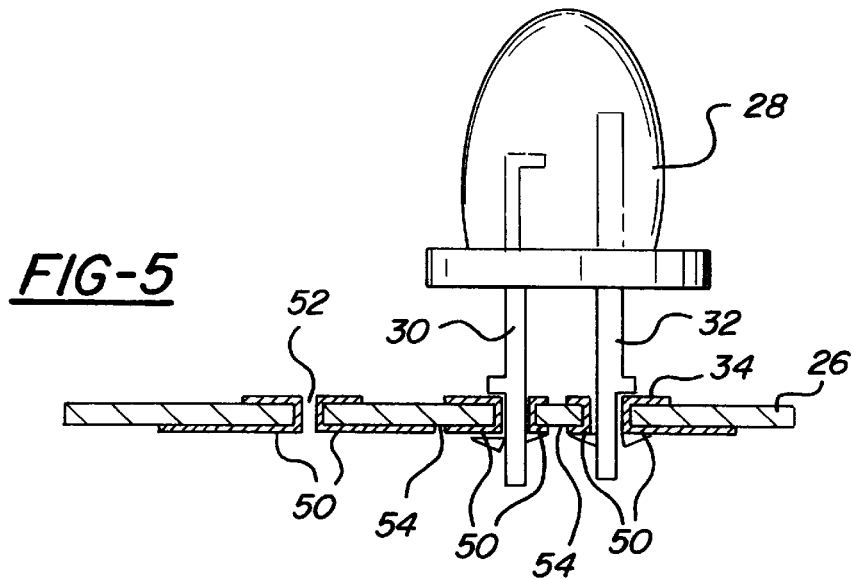
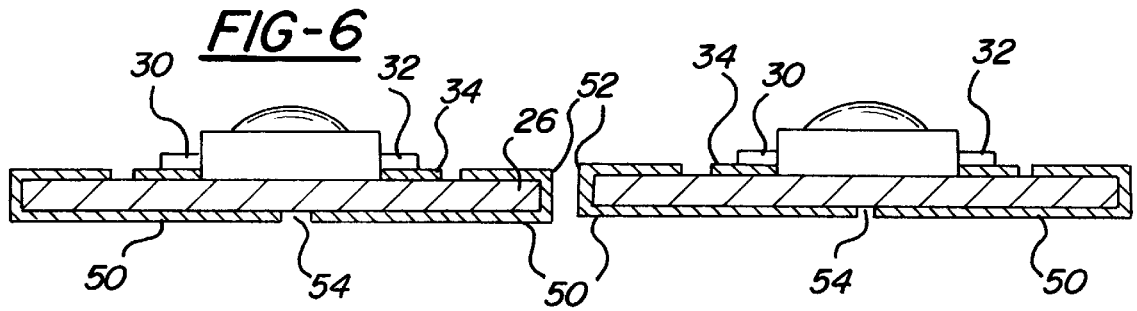
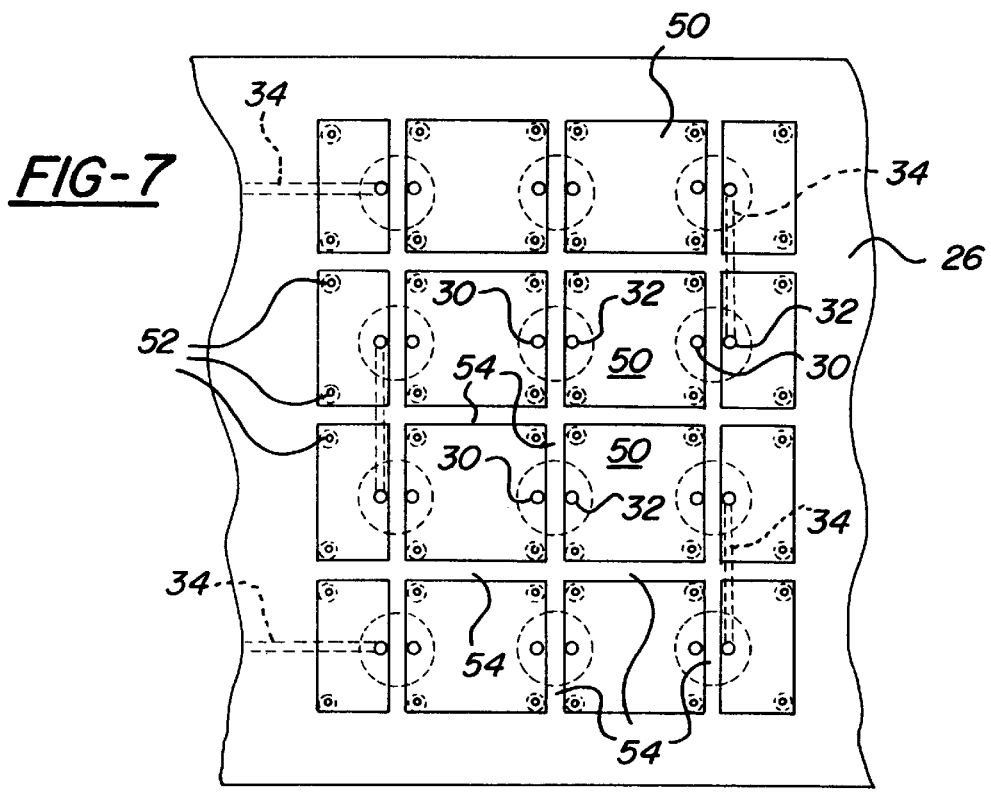

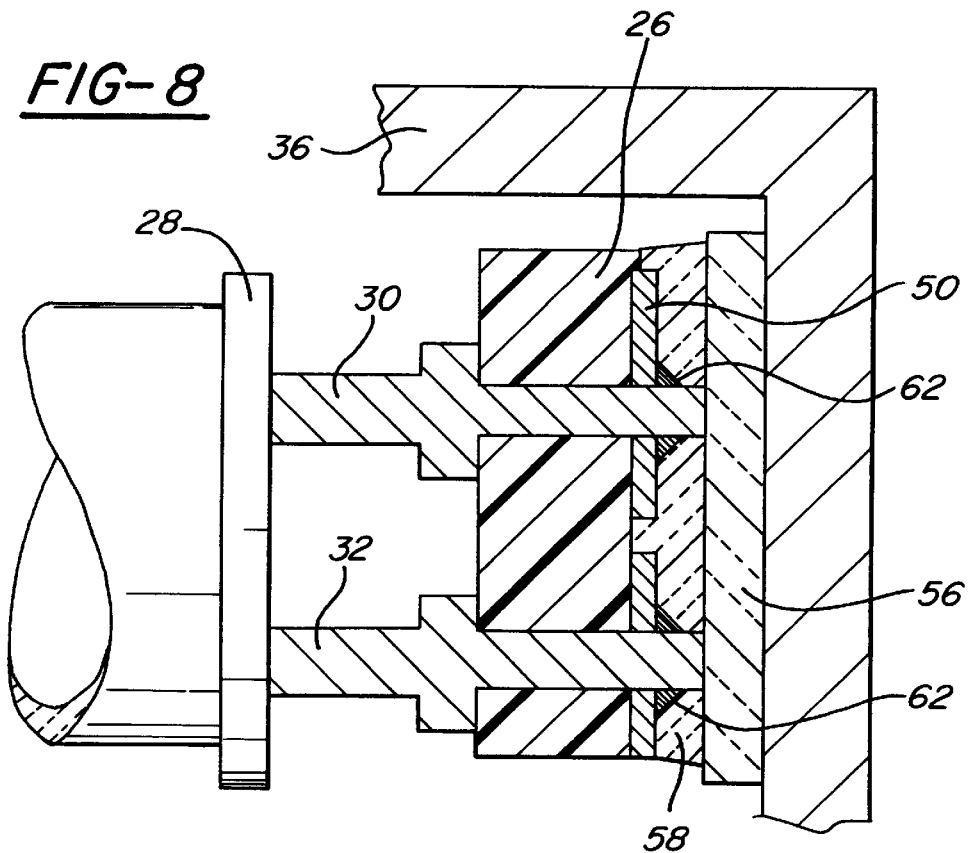
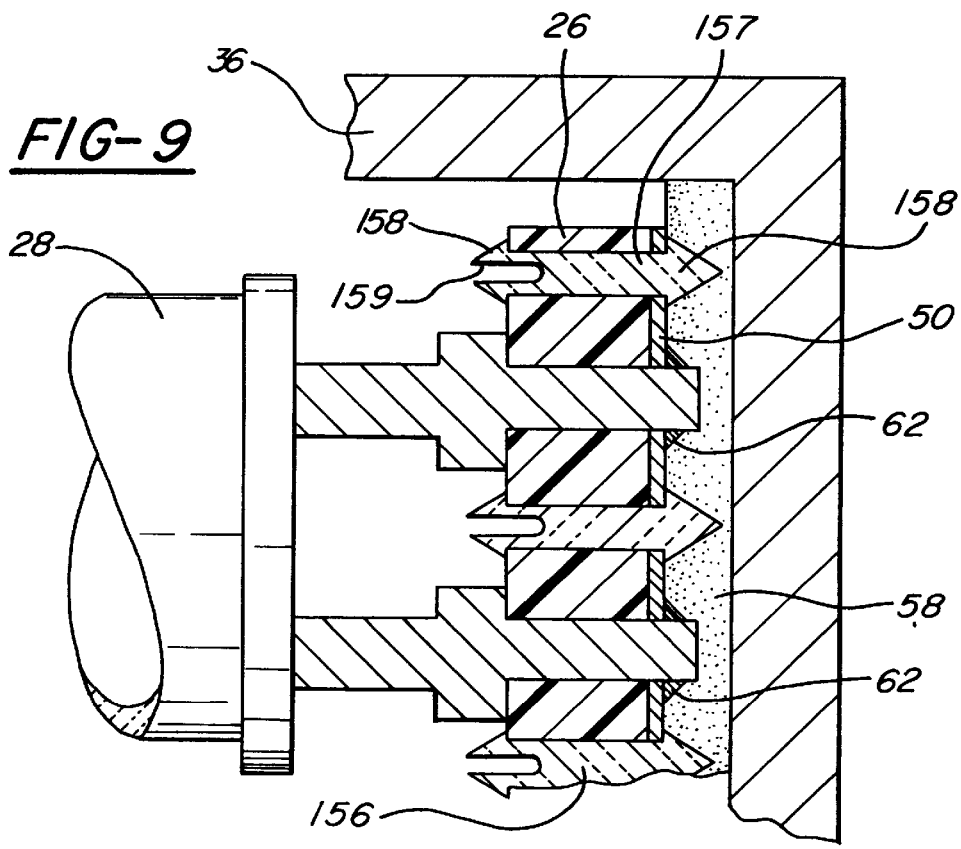

6,045,240

LED LAMP ASSEMBLY WITH MEANS TO CONDUCT HEAT AWAY FROM THE LEDS

RELATED APPLICATION

This application is a continuation-in-part of co-pending application Ser. No. 08/671,249 filed Jun. 27, 1996.

BACKGROUND OF THE INVENTION

1. Field of the Invention

The subject invention relates to light emitting diodes mounted in an array on a circuit board and, more particularly, to the dissipation of heat generated by the diodes. Such light emitting diode assemblies have particular utility in traffic signals.

2. Description of the Prior Art

Newly developed light emitting diode traffic signals are exhibiting useful service lives that are much shorter than predicted. The expected life of such signals is at least five to seven years, but actual field experience with some of these devices demonstrates significant dimming of the L.E.D. after two years or less. The relatively high cost of the L.E.D. conversions suggests that a minimum three year life is necessary in order to amortize the acquisition cost. Energy savings, which can exceed eighty percent, are typically used to finance the conversion of incandescent lamps to the L.E.D. variants, in combination with the cost savings attributed to lower relamping expenses.

Both the purchasers and manufacturers of L.E.D. traffic signals seem to be puzzled by the relatively poor performance of the devices in the field. It is important to note that most L.E.D. component manufacturers predict lifetimes in excess of one hundred thousand hours. The widely divergent results observed in actual field experience vis a vis that observed in a laboratory environment suggests that the field operating conditions are very unlike those used to predict device lifetimes.

L.E.D.s are commonly rated at some nominal average operating current (20 mA) and temperature (typically 25° C.) for a given luminous output. Useful life is specified as the point in time (hours) at which the luminous output is half the initial value.

Recent experiments with a wide variety of L.E.D.s suggest an exponential relationship of life versus operating temperature. The well known Arhenius function is an approximate model for LED degradation: $D\ te^{kT}$ where D is the degradation, t is time, e the base of natural logarithms, k an activation constant and T the absolute temperature in degrees Kelvin.

While this formulation is necessarily inexact, and is clearly device dependent, within a given L.E.D. family the empirical data can be modeled satisfactorily. The impact of this realization is dramatic. While room temperature (25° C.) lifetimes may in fact approach one hundred thousand hours, operation at close to 90° C. may reduce L.E.D. life to less than seven thousand hours.

Interestingly, neither users nor manufacturers of L.E.D.s specify operation of L.E.D. devices at temperatures approaching 90° C. Actual data collected in solar heating studies of traffic signals show that internal temperatures approaching 85° C. may be rather common in the U.S. Southwest. In fact, at ambient air temperatures of 40° C. which are rather common, solar gain within the traffic signal housing can further increase the temperature nearly 30° C., without even operating the L.E.D. signals. The added thermal loading due to power supply losses and L.E.D. dissipation pushes the actual L.E.D. operating environment to temperatures in excess of 85° C. (185° F.) for at least a significant part of the day.

The problem of high internal temperatures is exacerbated in cases where L.E.D. lamps are intermixed with incandescent lamps. For example, if, in a given housing, only the red incandescent lamp is converted to an L.E.D. lamp, and the amber and green incandescent lamps are retained, the heat generated by the illuminated incandescent lamps will greatly increase the temperature surrounding the L.E.D. lamp.

Obviously, venting the L.E.D. traffic lamp assembly or module into the sealed traffic signal housing, is futile. Rejecting heat into an environment of higher temperature than that of the source is thermodynamically impossible. The key to improving the life of the L.E.D.s in traffic signal service is to reduce the temperature of the L.E.D. environment. Note that little can be done to modify the "ambient" temperature which is the normal surrounding air temperature.

U.S. Pat. No. 4,729,076 to Masami et al strives to lower the temperature of the LED array by attaching a finned heat sink assembly. However, there is an impediment or restrictor in the path of the heat from the light emitting diodes to the heat sink; to wit, a resin filler or adhesive which is a very poor heat conductor. The Masami '076 patent recognizes the problem of positioning the heat sink within the traffic signal housing where it must exchange heat with the air within the housing. As noted in the Masami '076 patent, some means of ventilation must be provided by vents, louvers, fans or the like, when the heat sink is within the housing. Such provisions are not particularly effective in hot climates, and they subject the signal to dirt and moisture infiltration. Since the lens, reflector and lamp assembly is not separately sealed in traditional housings, moisture or dust that enters a conventional signal housing may degrade the optical performance of the unit and cause corrosion of exposed electrical components. Experiments with baffled vents suggest that substantial (size) openings at the bottom and top of the traffic signal housing would be necessary to provide unimpeded (low back pressure) air flow through the housing. Clearly, retrofitting LED lamps into existing traffic signal housings that do not have venting provisions is futile, because of heat loading. Field modification of existing housings to provide adequate venting is costly, time consuming and of limited utility because of the size of openings that are necessary. To overcome this venting problem, the Masami '076 patent suggests placing the heat sink on the back of the housing and exposed to ambient air with a heat conduit to transfer heat from the LEDs to the heat sink. Again, field modification of existing housings to mount a heat sink on the back of the housing is costly, time consuming and of limited utility because there still remains the restriction or impediment to heat transfer from the LEDs to the heat sink. Furthermore, heating of the heat sink by solar radiation would greatly reduce its effectiveness.

The luminous intensity of LEDs is a strong function of their temperature. Typically the highest performance LEDs available today, Al In Ga P devices, show a 0.9% per ° C. decrease in luminous output.

The amount of self generated heat in a large array of LEDs can be substantial. For example, a red traffic signal containing 300 discrete LEDs on a conventional circuit board can be expected to exhibit a temperature rise of over 30° C. in continuous operation. The resulting diminution in luminous output of nearly 30% is significant; when coupled with higher ambient temperatures that may be encountered in certain venues, this self generated heat can be crippling . . . reducing the luminous intensity of the signal to unsafe levels.

Several prior art patents address the question of heat extraction from an LED array, but an essential parameter in the successful implementation of this art has eluded previous investigators. Many technical issues must be carefully considered in the design of reliable LED signals, but among the most important are the thermal properties of the various components that form the heat flow path.

The tremendous disparity in thermal conductivity among materials used in electronic construction is instructive and is shown in the following table:

| | THERMAL CONDUCTIVITY TABLE | |
|---|---|---|
| | Material | (K) |
| 1. | Still Air | 0.2 |
| 2. | Epoxy Resin (unfilled) | 1.0 |
| 3. | Polyester Film | 1.1 |
| 4. | Mica | 3.7 |
| 5. | Thermally Conductive (filled) Epoxy (Electrically Insulating) | 10.7 |
| 6. | Silver Conductive Epoxy | 12.0 |
| 7. | Steatite | 19.1 |
| 8. | Alumina | 237 |
| 9. | Alloy Steel | 415 |
| 10. | Aluminum | 1700 |
| 11. | Copper | 2500 |

*Thermal conductivity (K) in BTU/hr · ft$^2$ – ° F./in

The interaction of the thermal properties of some of these materials, in LED arrays, indicates that prior approaches to the problem were not well conceived nor well understood. In fact, studies of existing hardware that embody the technology described by the prior art, show that at least an order of magnitude improvement in performance is attainable by the application of the methods and apparatus of the present invention.

Typically, the prior art, as exemplified by Roney, et al. in U.S. Pat. Nos. 5,528,474 and 5,632,551, comprises an LED circuit board potted or encapsulated in a filled resin matrix within a metal shell. The intended purpose of the filled resinous encapsulant, which may be a thermally conductive epoxy, is to conduct heat from the LED array into the metal housing which acts as a heat dissipator.

The improvement in thermal performance of LED devices that embody the technology taught by Roney, et al. over the apparatus disclosed by Masami, et al. in U.S. Pat. No. 4,729,076 is substantial.

Masami's use of unfilled resin and a non thermally coupled insulation sheet greatly diminishes the flow of heat from the LED array to the heat dissipator.

SUMMARY OF THE INVENTION AND ADVANTAGES

An electrically driven L.E.D. lamp assembly comprising an electrically insulating circuit board having opposed first and second surfaces with light emitting diodes mounted on the first surface. Each of the light emitting diodes has a positive and a negative lead thermally connected to a thermally conductive plating on the second surface to conduct heat from the leads to the conductive plating. A heat sink overlies the conductive plating and an adhesive layer of thermally conductive adhesive is disposed between the conductive plating and the heat sink to secure the conductive plating and the circuit board to the heat sink. The assembly is characterized by an electrically non-conductive spacer for preventing contact between the conductive plating and the heat sink to prevent electrical shorting between the conductive plating and the heat sink while maximizing heat transfer from the conductive plating to the heat sink.

The invention also includes a method of fabricating the L.E.D. lamp assembly wherein the adhesive layer of thermally conductive adhesive is applied between the thermally conductive plating and the heat sink to secure the thermally conductive plating and the board to the heat sink, and the method is characterized by disposing an electrically non-conductive spacer between the heat sink and the thermally conductive plating for preventing contact between the thermally conductive plating and the heat sink to prevent electrical shorting between the thermally conductive plating and the heat sink while maximizing heat transfer from the thermally conductive plating to the heat sink.

BRIEF DESCRIPTION OF THE DRAWINGS

Other advantages of the present invention will be readily appreciated as the same becomes better understood by reference to the following detailed description when considered in connection with the accompanying drawings wherein:

FIG. 5 is an enlarged fragmentary cross sectional view of an LED with leads extending through the board;

FIG. 6 is an enlarged fragmentary cross sectional view of a LED surface mounted on the board;

FIG. 7 is a fragmentary plan view of the second side of the board showing the thermal pads;

FIG. 8 is an enlarged fragmentary cross sectional view of a LED mounted on the circuit board with two distinct thermally conductive layers securing the circuit board to the heat sink while preventing shorting therebetween; and FIG. 9 is an enlarged fragmentary cross sectional view of a LED mounted on the circuit board with an adhesive layer securing the circuit board to the heat sink with elements extending through the circuit board to prevent shorting.

DETAILED DESCRIPTION OF THE PREFERRED EMBODIMENTS

Figure 1:
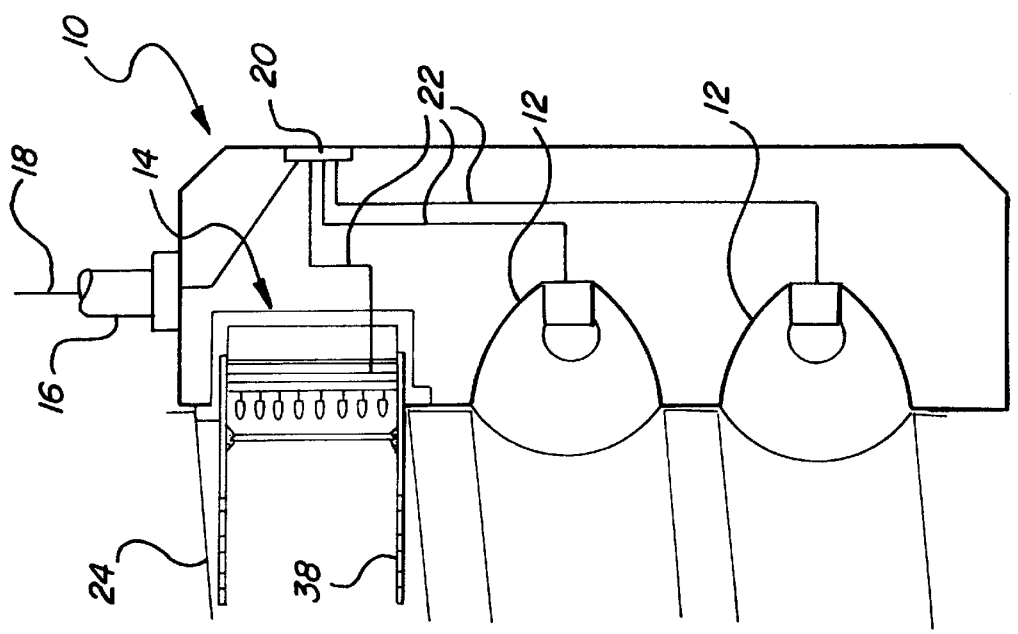
FIG. 1 is a cross sectional view of a traffic light enclosure with the prior art incandescent lamp in two of the openings and a preferred embodiment of the subject invention mounted in the upper opening.

Referring to the Figures, wherein like numerals indicate like or corresponding parts throughout the several views, a traffic light housing is indicated at 10 in FIG. 1. Conventional incandescent lights 12 are mounted in the housing 10. In addition an electrically driven light emitting diode (L.E.D.) lamp assembly, constructed in accordance with the subject invention and generally indicated at 14, is also mounted in the housing 10. The traffic light housing 10 is hung by a hanger 16 through which an electrical power line 18 leads to a terminal block 20. Respective leads 22 transfer electrical power to each of the lights 12 and the lamp assemblies 14. Conventional sun hoods 24 extend forwardly about the opening in the housing in which the lamp assemblies are mounted.

Figure 2:
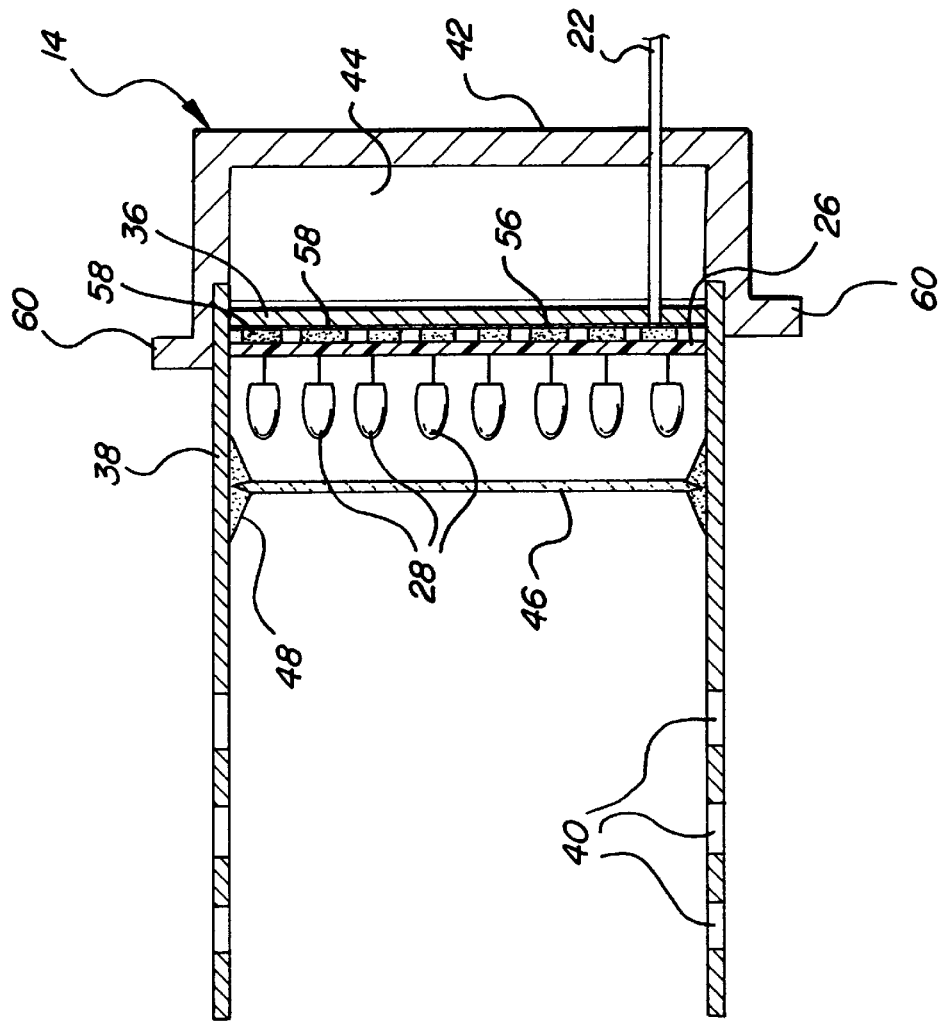
FIG. 2 is a cross section view of a preferred embodiment of the subject invention.

One embodiment of the electrically driven L.E.D. lamp assembly 14 is best shown in FIG. 2 and comprises an electrically insulating circuit board or substrate 26 having opposed first and second surfaces with light emitting diodes L.E.D.'s 28 having leads 30 and 32 (positive and negative) mounted on the first surface and an electrical or conductive plating on the first surface for establishing discrete and electrically conductive paths 34 for electrically interconnecting the positive lead 30 of one the light emitting diodes 28 to the negative lead 32 of another of the light emitting diodes 28.

A heat sink includes a base 36 overlying the second or back surface of the circuit board and a tubular shell 38 extending forwardly from the base 36 in front of the light emitting diodes 28 for conducting heat to the light emitting side of the assembly. In other words, the shell 38 conducts heat from the LEDs of the back side of the circuit board to the ambient air within the sun hood 24, it being important that the shell 38 be spaced radially from the sun hood 24 to allow the free circulation of air and to prevent the transfer of heat from the hood 24 to the shell 38. To increase heat transfer, the shell 38 may include perforations 40 therein to allow for air passage and increase the surface area for radiating heat. The length of the shell 38 is chosen to effect the desired dissipation, and it may be shortened to extend only to the transparent cover 46.

A casing or plastic cover 42 surrounds the base 36 of the heat sink and insulating material 44 is disposed between the base 36 and the casing 42 to limit heat transfer to the heat sink from outside the casing 42. A transparent cover 46 is retained within the shell 38 by a weather seal 48.

Figure 3:
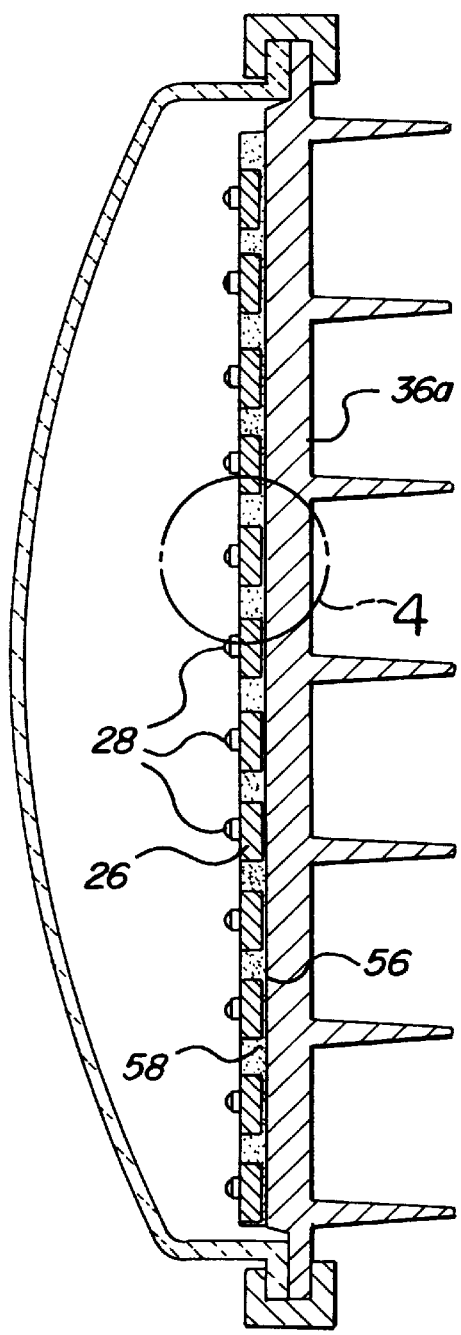
FIG. 3 is a cross sectional view of a second embodiment.
Figure 4:
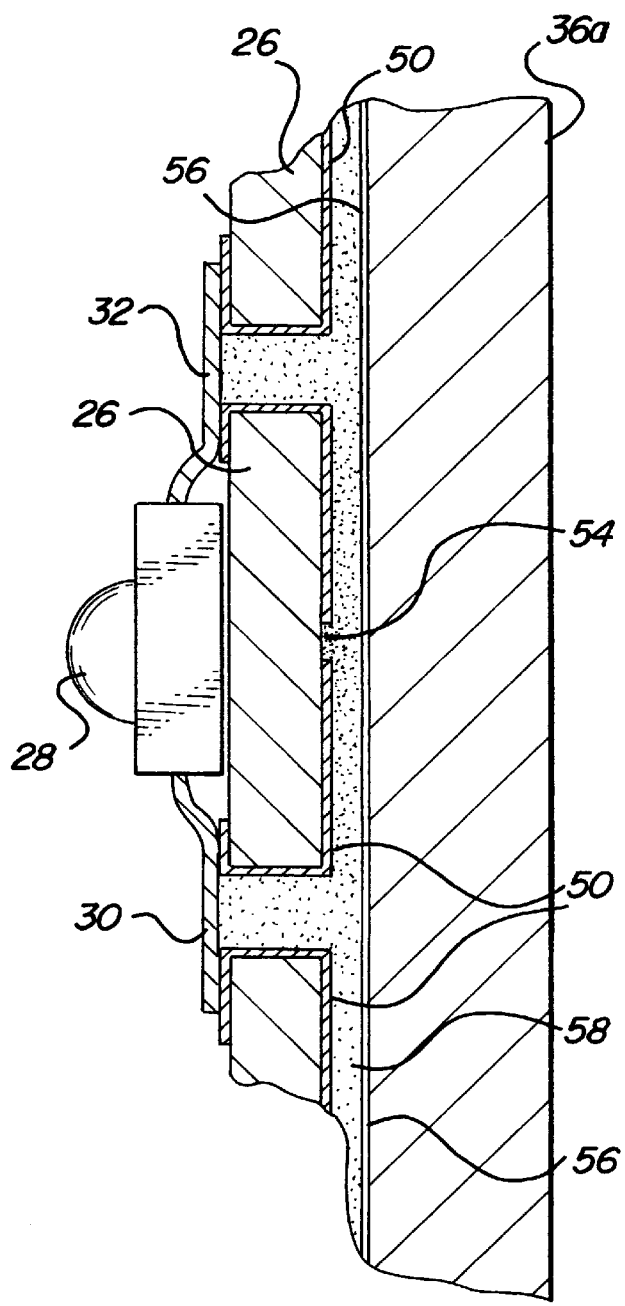
FIG. 4 is an enlarged cross sectional view of a portion of FIG. 3.

In order to increase the transfer of heat from the circuit board 26 to the heat sink, whether it be the improved base 36 and shell 38 or the conventional base 36($a$) with fins shown in FIGS. 3 and 4, the electrically insulating circuit board 26 has a plurality of holes extending therethrough and a plurality of pads 50 defining a thermally conductive plating on the second side with each pad 50 associated with one of the holes. In some instances the holes may be the holes through which the LED leads 30 and 32 extend with each of the lead holes providing thermal conductivity to one of the pads 50. In addition to the lead holes for the leads 30 and 32, there may be included a plurality of holes 52 dispersed among the lead holes, as shown in FIG. 5. In the case of surface mounted LEDs, the LED leads 30 and 32 may extend over the lead holes as shown in FIG. 4 or there are no lead holes and only the through holes 52 are provided as shown in FIG. 6. In all cases the plating material is homogeneous, that is, the electrical paths 34 between LED leads 30 and 32 are integral with and are an extension of the pads 50 by extending through the lead holes and the specially provided holes 52. Accordingly, heat is transferred from the leads 30 and 32 through the plating as it continues through the holes and into the pads 50.

The pads 50 extend laterally from the holes and are separated from one another a discrete distance or space 54 (alternatively referred to as spaces, lines or isolation traces or crossing lines of separation) which is only of a magnitude sufficient to prevent electrical conductivity from pad to pad. Therefore, the thermally conductive material extends through the holes and thermally connects each of the pads 50 and one of the leads 30 or 32 to conduct heat from each of the leads to one of the pads 50 while maintaining electrical isolation between the pads 50 by the spaces 54 therebetween. The pads 50 are multi-sided, i.e., rectangular in area configuration and are separated by space 54 defined by a grid of crossing lines of separation, the lines or spaces 54 being in transverse groups with all the lines or spaces 54 in one group being parallel and at right angles to the lines or spaces 54 in the other group. It will be appreciated, however, the shapes of the pads 50 may vary, hexagonal being an efficient use of area.

In order to conduct as much heat as possible per unit of time the heat sink should overlay the pads 50 with minimal spacing therebetween while, at the same time preventing contact between the heat sink and the pads 50 to prevent electrical shorting between the pads 50. Accordingly, a thin electrically insulating layer 56 of electrically insulating material disposed between the pads 50 and the heat sink to prevent electrical shorting between the pads 50 by the flow of electrical current through the heat sink. An adhesive layer 58 secures the board 26 to the insulating layer 56. The adhesive 58 is a thermally conductive epoxy or thermally bonding compound defining an electrically insulating layer. Without the electrically insulating layer 56, the pads 50 could be pressed into engagement with the metal, preferably aluminum, base 36 or 36($a$). Therefore, the thin electrically insulating layer 56 acts as an electrically non-conductive spacer for preventing contact between said conductive plating and the base 36 of the heat sink to prevent electrical shorting between said conductive plating and the heat sink while maximizing heat transfer from the conductive plating to the heat sink. On the other hand, the adhesive layer 58 may itself comprise the electrically insulating but heat conductive layer to both secure the board 26 and pads 50 to the base 36 or 36($a$) of the heat sink. In other words, the adhesive layer 58 could be used without the electrically insulating layer 56 so long as the pads are maintained in spaced non-conductive relationship with the heat sink, or both the adhesive layer 58 and the thin electrically insulating layer 56 could be laminated together.

The majority of the area, which is occupied by the pads 50, the holes (lead holes and additional holes 52) and the discrete spaces 54, on said second side of the board is taken up by the pads 50. In other words, the pads 50 occupy the majority of the area of the bottom of the board 26, i.e., only enough space is devoted to the discrete nonconductive distances to prevent electrical shorting. Clearly, the majority is over sixty percent.

As noted, some traffic signal housings may reach internal temperatures of 90° C. (195° F.) in high solar loading conditions. While venting the housing is certainly possible, the necessity for substantial field work on the housing may be costly and inconvenient. Accordingly, this invention provides other means of rejecting LED heat to the environment (surrounding air). Instead of trying to reject heat into the traffic signal housing which may in fact be at a higher temperature than the LED assembly itself, one aspect of the present invention is to facilitate rejection of heat through the front of the signal housing, around the lens opening.

As shown in FIG. 2, the array of LED's is enclosed in a thermally conductive metal tube or cylindrical shell 38 which can conduct heat from the base or bottom 36 along the side walls of the shell 38 to outside ambient air. That is, instead of trying to reject heat to the air within the traffic signal housing, heat is directly rejected to outside air. The use of a cylindrical heat sink with an integral (flat) base 36 as shown, allows for efficient coupling of the LED mounting substrate or circuit board 26 to the enclosure base 36 by means of a thermally conductive (loaded) epoxy 58. While optimal, such coupling may not be necessary in all cases, and thermal exchange by means of the heated air would suffice. Added thermal coupling between the walls of the shell 38 of the metallic cup and the heated air will further improve heat dissipation of the LED array. In most cases, traffic signals are equipped with shading hoods 24 to improve signal visibility. These hoods 24 are commonly canted at about 7½° to the horizon, and effectively keep direct sunlight out of the signal lens. The proposed metal heat sink comprising base 36 and the shell 38, which is preferably fabricated of drawn, extruded or spun aluminum or of die cast aluminum, fits within the hood 24. A small air space between the outer hood 24 and inner tubular shell 38 keeps thermal coupling between these two components at a minimum. The outer hood 24 is usually exposed to direct sunlight and can get much hotter than the surrounding air.

The small perforations 40 in the shell 38, outside the sealed region of the LED lamp will prevent thermal stagnation of air trapped between the two tubular sections. A blackened interior cylindrical surface may be provided to enhance contrast (currently common practice) and improve emissivity. Since the base 36 of the cylindrical shell is thermally conductive, heat from the interior of the signal housing 10 could be added to the LED lamp 14 unless insulation is provided at the base of the LED housing. A simple plastic cover 42 with an air space or thermal insulation material 44 will effectively thermally decouple the signal housing 10 from the LED signal lamp 14. Provisions for mounting the LED lamp 14 in standard housings 10 could be accommodated by merely including a flange 60 on the outer diameter of the rear cover 42. Note that the use of existing sun hoods 24 prevents direct solar heating of the aluminum shell 38, which would add significant heat to the LED array. In cases where maximum heat dissipation from a shell 38 is not necessary, the tubular shell 38 may not have to extend beyond a front cover 46 into the sun hood 24.

The transparent, clear or tinted front cover 46 could be inserted in the tubular shell 38 to seal the LED lamp 14 against moisture and dust. Lenses, prisms or other beam steering optics could be incorporated into the transparent front cover 46 or alternatively be added as a separate optical assembly. Compliant sealing agents such as various elastomers, plastics or epoxies could be used to mount the front cover 46 to the tubular shell 38 for sealing and to allow for differential thermal expansion between the plastic and metal elements, which are exposed to a wide range of operating temperatures.

In order to accommodate the nominal 7½° canted sun hoods 24, the LED lamp assembly 14, including the tubular shell 38, could be similarly canted by the mounting flange 60. Since virtually all properly designed signals exhibit an asymmetric optical pattern, the unique canted configuration ensures that the signal will be correctly installed in the housing. That is, the LED lamp 14 cannot be mounted out of position because the canted tubular shell 38 would physically interfere with the sun hood 24.

In colder regions, blown snow can effectively obscure signals, leading to potentially dangerous situations. Heat conducted along the tubular heat sink will help melt any snow that accumulates in the signal opening.

The other feature of the present invention is the enhanced thermal dissipation from the LEDs as they are mounted onto a thermally conductive heat sink. As noted, a thermally conductive adhesive layer 58 such as a filled epoxy or resin may be used to transfer heat from the LED array and circuit board 26 to the metallic base 36, 36(a) of the heat sink. However, the best thermally conductive, electrically insulative compounds exhibit heat transfer coefficients that are orders of magnitude lower than most metals. To remedy this situation, the LED leads 30 and 32 are soldered or bonded to the respective conductive pads 50 on the circuit board 26 (printed circuit board) in a manner so as to maximize the thermal transfer from the LED component leads 30 and 32 to the conductive pads 50.

Commonly, circuit boards are designed with small isolated pads or islands of copper on the supporting board. The necessary circuitry interconnects and/or isolates the various components as required. Plated through holes or vias generally interconnect the conductor pattern or paths 34 on one side to the other side of the board for electrical continuity.

A very beneficial improvement in heat extraction from the LEDs 28 to the substrate 26 and from the substrate to the base 36, 36(a) is achieved by this modification of standard circuit board practice. As shown in FIGS. 2, 5 and 6, a standard circuit board 26 is provided with double sided copper plating. The first side is configured with the necessary interconnection lines or paths 34 and component connectors, while the second side, the side mounted against the conductive heat sink, is etched to retain virtually all the copper cladding, as is shown in FIG. 7. In order to retain component isolation, fine openings or isolation traces or spaces 54 are etched into this heat spreader layer. The function of these large conductive pads (copper) 50 is to act as heat spreaders that take the heat from the LED leads 30 and 32 and dissipate it to the mounting surface of the substrate where it can be driven into the thermally conductive base 36, 36(a) of the heart sink. A large number of plated through holes may be used to interconnect the topmost and the bottom layer. That is, plated through holes that are normally used only for electrical coupling are used for thermal coupling. A typical enhanced thermal dissipation LED assembly will have many more unoccupied (component-less) holes 52 in addition to the holes filled with the leads 30 and 32 of the active components. An additional benefit of these "extra" holes 52 is the ability of the thermal bonding compound (resin) 58 to partly fill the holes 52 and improve physical attachment, while enhancing thermal transfer, to the thermally conductive base 36, 36(a) of the heat sink.

The embodiment of FIG. 8 is similar to FIG. 5 in that the leads 30 and 32 extend through the circuit board 26 and are soldered by solder 62 to a conductive plating 50 on the second surface of the circuit board 26, but there is no conductive plating on the first surface of the circuit board 26. The conductive plating 50 in FIG. 8 defines the electrical connections from lead 30 to lead 32 of adjacent LEDs 28 and also defines thermally conductive pads for transmitting heat to the base 36. Accordingly, the pads defined by the conductive plating of FIG. 8 occupies as much area as possible, normally the pads 50 which also serve to electrically interconnect the LEDs occupy over fifty percent of the area of the second surface of the circuit board.

The embodiment of FIG. 8 is also like the embodiment of FIG. 4 in that it includes a thin electrically insulating layer 56 of electrically insulating material disposed between the pads 50 and the base 26 to prevent electrical shorting between the pads 50 and the heat sink 36. Again, the thin electrically insulating layer 56 of electrically insulating material acts an electrically non-conductive spacer for preventing contact between the conductive plating and the heat sink to prevent electrical shorting between the conductive plating and the heat sink while maximizing heat transfer from the conductive plating to the heat sink. This is accomplished in the method of fabrication by disposing the electrically non-conductive spacer, i.e., thin electrically insulating layer 56, between the base 36 and the thermally conductive plating defined by the pads 50 for preventing contact between the thermally conductive plating and the heat sink to prevent electrical shorting between the thermally conductive plating and the heat sink while maximizing heat transfer from the thermally conductive plating to the heat sink and applying an adhesive layer of thermally conductive adhesive between the thermally conductive plating and the heat sink to secure the thermally conductive plating and the board to the heat sink. The method of fabrication may be further defined as first applying the thin electrically insulating layer 56 of the same material as the adhesive layer 58 in a soft state, i.e., paste, and curing the thin electrically insulating layer 56 into a hard state followed by applying the adhesive layer 58 of the same adhesive after the thin electrically insulating layer 56 is cured while urging the circuit board 26 toward the heat sink 36 while curing the adhesive layer 58 as the spacer or thin electrically insulating layer 56 prevents contact between the conductive plating defined by the pads 50 and the heat sink 26, whereby the hard thin electrically insulating layer 56 act as a spacer to prevent contact between the conductive plating defined by the pads 50 and the heat sink 36. Structurally, the thin layer defining the spacer, when it comprises the same material as the adhesive layer, is cured differently from the adhesive layer. Perhaps the only discernable difference between the two layers 56 and 58 would be the mating interface between the two layers 56 and 58. As mentioned above, the adhesive layer 58 and the layer 56 are both preferably thermally conductive as well as electrically non-conductive, i.e., electrically insulating to prevent shorting. Typically, the combined or aggregate thickness of these thermally conductive but electrically insulating layers 56 and 58 is no more than 0.25 mm or about 0.010 inch.

The embodiment of FIG. 9 differs from the previous embodiments only in that the spacer comprises elements 156 defining spaces therebetween and the adhesive layer 58 fills the spaces and interconnects the conductive plating defined by the pads 50 and the heat sink 36. The additional or especially provided holes 52 in the circuit board 26 are used to receive the elements 156 which are supported in the holes and extend from the second surface of the circuit board 26. Each element 156 comprises a shaft 157 interconnecting arrowheads 158. One of the arrowheads 158 hooks over the conductive pads 50 on the second surface of the circuit board whereas the other arrowhead has a slot 159 therein for allowing radial compression as the element is inserted through the hole 52. Once through the hole 52 the arrowhead with the slot expands to hook over the first surface of the circuit board 26, thereby retaining the element 156 to the circuit board 26.

The elements could also be defined by an electrically insulating screen mesh.

The present invention solves the shorting problem by first forming a relatively thin (0.15 mm or nom. 0.006 in) first electrically insulating or spacing layer on the metallic heat dissipator, which may also be the housing or enclosure for the LED array. This electrically insulating layer is thermally conductive, and is ideally formed of the same material then used to bond the circuit board and LED assembly to the heat dissipator. Naturally, the initial (first) insulating and spacing layer must be cured or set to form an essentially impenetrable layer prior to attachment of the circuit board. Otherwise, electrically conductive projections or traces on the circuit board could mechanically displace the uncured, thixotropic coating, and electrically short circuit to the heat dissipator which is typically a metallic element.

The mechanically impenetrable first layer of electrically insulating material may also consist of a thin polyester film that is thermally coupled by a conductive bonding medium to the heat dissipator. The thermal bonding agent ensures that there is no air gap between said film and dissipator, thereby enhancing thermal conduction. Difficulties in obtaining a continuous, air pocket free film have led to the use of perforated films which allow for expulsion of trapped air during assembly, and such perforated films enhance the adhesion and mechanical retention of the circuit board assembly. Alternately, a fine mesh screen of insulating material may be used in lieu of the separately applied first insulating layer. The screen spacer provides the mechanically impenetrable layer necessary for insulating the circuit board from the metallic heat dissipator. However, openings in the screen must be sized so as not to allow electrically conductive projections from the circuit board to contact the dissipator, while allowing free flow of the thermally conductive adhesive through the screen.

In cases where thermal coupling is critically important and must be optimized, electrically insulating chemical conversion coatings or anodic coatings might be used directly on the metallic dissipator. For example, an aluminum heat dissipator might be electrolytically or chemically anodized to form a mechanically impervious, electrically insulating coating of excellent thermal conductivity. Extra handling and cost constraints would limit such techniques to limited, more critical applications.

Adhesive attachment of the circuit board and LED assembly to the heat dissipator and impenetrable first insulator, is simple and can be accomplished with the thermally conductive epoxy adhesive noted earlier. Periodic perforations of the circuit board may be used to enhance the bonding process by allowing trapped air to escape as the circuit board is pressed or laminated to the heat dissipator.

A continuous first electrically insulating layer 56 acting as a spacer is only one means of providing critically important insulation, as evidenced by the successful use of an electrically insulating screen. As shown in FIG. 9 as a multiplicity of spacing elements 156 may be used to prevent any electrically active portion of the circuit board assembly from contacting the heat dissipator, even as the circuit board is pressed onto or into the conductive heat dissipator. Such nubs or spacer elements 156 may have the form of self locking pins that are pressed into the LED circuit board assembly. Depending on the flexibility of the circuit board substrate, these spacing nubs may be placed at periodic intervals. Ideally, such spacers are machine insertable and may be molded of any convenient electrical insulator such as nylon or acetal. An even coating of uncured, filled, thermally conductive/electrically insulating resin could then be applied to the smooth surface of the heat dissipator by stencil or screen printing means. Assembly of the LED circuit board to the heat dissipator would simply displace the adhesive resin with the spacer nubs, and establish a fixed, insulative stand-off distance between said circuit board and heat dissipator. Subsequent curing of the adhesive, filled resin would establish a low impedance heat flow path from the LEDs to the heat dissipator. Furthermore, the cured, rigid, filled epoxy resin would mechanically secure the LED array within the housing or to the heat dissipator.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. An electrically driven L.E.D. lamp assembly comprising;

an electrically insulating circuit board having opposed first and second surfaces, light emitting diodes mounted on said first surface, each of said light emitting diodes having positive and negative leads, a thermally conductive plating on said second surface, said conductive plating being thermally connected to said leads to conduct heat from said leads to said conductive plating, a heat sink overlying said conductive plating, an adhesive layer of thermally conductive adhesive disposed between said conductive plating and said heat sink to secure said conductive plating and said board to said heat sink, said assembly characterized by an electrically non-conductive spacer for preventing contact between said conductive plating and said heat sink to prevent electrical shorting between said conductive plating and said heat sink while maximizing heat transfer from said conductive plating to said heat sink.

2. An assembly as set forth in claim 1 wherein said conductive plating is divided into a plurality of pads, said pads being separated form one another a discrete distance which only of a magnitude sufficient to prevent electrical conductivity from pad to pad, each of said pads being thermally connected to one of said leads to conduct heat from each of said leads to one of said pads while maintaining electrical isolation between said pads.

3. An assembly as set forth in claim 1 wherein said conductive plating is divided into conductors for electrically connecting one of said leads of adjacent light emitting diodes, said conductive plating covering over fifty percent of the area between the leads of adjacent diodes for maximizing the heat transfer to said heat sink.

4. An assembly as set forth in claim 3 including solder connecting said leads to said conductive plating on said second surface.

5. An assembly as set forth in claim 1 wherein said adhesive layer is also electrically insulating.

6. An assembly as set forth in claim 5 wherein said spacer is also thermally conductive.

7. An assembly as set forth in claim 6 wherein said spacer comprises a thin layer.

8. An assembly as set forth in claim 7 wherein said thin layer comprises the same material as said adhesive layer but cured differently from said adhesive layer.

9. An assembly as set forth in claim 6 wherein said spacer comprises elements defining spaces therebetween and said adhesive layer fills said spaces and interconnects said conductive plating and said heat sink.

10. An assembly as set forth in claim 9 wherein said circuit board includes holes therein and said elements are supported in said holes and extend from said second surface of said circuit board.

11. A method of fabricating a L.E.D. lamp assembly comprising the steps of:

providing an electrically insulating circuit board having opposed first and second surfaces with light emitting diodes mounted on the first surface and a thermally conductive plating on the second surface and thermally connected to the leads of the light emitting diodes to conduct heat from each of the light emitting diodes to the thermally conductive plating, providing a heat sink for overlying the thermally conductive plating, applying an adhesive layer of thermally conductive adhesive between the thermally conductive plating and the heat sink to secure the thermally conductive plating and the board to the heat sink, said method characterized by disposing an electrically non-conductive spacer between the heat sink and the thermally conductive plating for preventing contact between the thermally conductive plating and the heat sink to prevent electrical shorting between the thermally conductive plating and the heat sink while maximizing heat transfer from the thermally conductive plating to the heat sink.

12. A method as set forth in claim 11 further defined as applying a thin layer over the heat sink to define the spacer.

13. A method as set forth in claim 12 further defined as applying the thin layer in soft state and curing the thin layer into a hard state.

14. A method as set forth in claim 12 further defined as applying the thin layer of the same material as the adhesive layer in a soft state and curing the thin layer into a hard state, and applying the adhesive layer after the thin layer is cured whereby the hard thin layer prevents contact between the conductive plating and the heat sink.

15. A method as set forth in claim 11 further defined as disposing elements defining spaces therebetween to define the spacer, and applying the adhesive layer to fill the spaces to interconnect the conductive plating and the heat sink.

16. A method as set forth in claim 15 further defined employing a circuit board including holes therein and disposing the elements in the holes to extend from the holes and the second surface of the circuit board.

17. A method as set forth in claim 11 including the step of urging said circuit board toward the heat sink while curing the adhesive layer as the spacer prevents contact between the conductive plating and the heat sink.

18. A method as set forth in claim 17 further defined as applying an adhesive layer which is also electrically insulating.

19. A method as set forth in claim 18 further defined as disposing a spacer which is also thermally conductive.

* * * * *